United States Patent
Kawata

(10) Patent No.: US 11,808,645 B2
(45) Date of Patent: Nov. 7, 2023

(54) ELECTRO-OPTICAL DEVICE AND ELECTRONIC APPARATUS

(71) Applicant: SEIKO EPSON CORPORATION, Tokyo (JP)

(72) Inventor: Hidenori Kawata, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 68 days.

(21) Appl. No.: 17/155,035

(22) Filed: Jan. 21, 2021

(65) Prior Publication Data

US 2021/0231510 A1    Jul. 29, 2021

(30) Foreign Application Priority Data

Jan. 23, 2020 (JP) ................................. 2020-008949

(51) Int. Cl.
| | |
|---|---|
| *G01L 1/22* | (2006.01) |
| *G02F 1/1362* | (2006.01) |
| *G02F 1/1335* | (2006.01) |
| *G03B 21/00* | (2006.01) |
| *H01L 27/12* | (2006.01) |

(52) U.S. Cl.
CPC .......... *G01L 1/22* (2013.01); *G02F 1/133512* (2013.01); *G02F 1/136286* (2013.01); *G03B 21/006* (2013.01); *H01L 27/1214* (2013.01)

(58) Field of Classification Search
CPC ............... G01L 1/22; G02F 1/133512; G02F 1/136286; G03B 21/006; H01L 27/1214
See application file for complete search history.

(56) References Cited

U.S. PATENT DOCUMENTS

| | | | | |
|---|---|---|---|---|
| 2013/0215056 | A1* | 8/2013 | Johansson | G01D 3/036 345/173 |
| 2014/0331781 | A1* | 11/2014 | Lee | G06F 3/0487 73/849 |
| 2015/0091016 | A1* | 4/2015 | Chen | G09G 3/3225 257/72 |
| 2016/0377501 | A1 | 12/2016 | Agarwal et al. | |
| 2018/0005592 | A1 | 1/2018 | Okamoto | |
| 2018/0033398 | A1* | 2/2018 | Okamoto | G09G 3/3233 |
| 2018/0039363 | A1* | 2/2018 | Liu | G01L 1/2281 |
| 2018/0292933 | A1* | 10/2018 | Hu | G01L 1/2262 |
| 2021/0223871 | A1* | 7/2021 | Shang | G09G 3/035 |

FOREIGN PATENT DOCUMENTS

| | | |
|---|---|---|
| JP | 2016206435 | 12/2016 |
| JP | 2018010293 | 1/2018 |
| JP | 2018025768 | 2/2018 |

* cited by examiner

*Primary Examiner* — Edward J Glick
*Assistant Examiner* — David Y Chung
(74) *Attorney, Agent, or Firm* — JCIPRNET

(57) ABSTRACT

An electro-optical device includes an electro-optical panel that includes a first strain sensor element including a first resistance member and a second strain sensor element including a second resistance member that are provided in a pixel area, and a first wiring electrically coupling the first strain sensor element and the second strain sensor element, a first variable resistance member, a second variable resistance member, and a second wiring electrically coupling the first variable resistance member and the second variable resistance member.

9 Claims, 14 Drawing Sheets

ELECTRO-OPTICAL DEVICE AND ELECTRONIC APPARATUS

The present application is based on, and claims priority from JP Application Serial Number 2020-008949, filed Jan. 23, 2020, the disclosure of which is hereby incorporated by reference herein in its entirety.

BACKGROUND

1. Technical Field

The present disclosure relates to an electro-optical device and an electronic apparatus.

2. Related Art

In a transparent liquid crystal panel used as a light valve of a projector, a phenomenon has been observed in which a liquid crystal panel is strained due to intense light irradiation from a light source, a change over time, and the like, and then the thickness of a liquid crystal layer changes. As the thickness of the liquid crystal layer changes leads to display failures such as luminance unevenness, a technique for detecting this phenomenon is required.

As a sensing means, it is conceivable to bond a strain sensor to the liquid crystal panel. For example, JP-A-2018-10293 discloses an information terminal including a strain sensor in a display panel. The display panel is a hybrid panel in which a reflective panel and an organic electro luminescence (EL) panel are overlapped, and a strain sensor was provided between the reflective panel and the organic EL panel. In response to the strain sensor detecting that the display panel has been bent, the display/non-display of the bent portion is switched. In addition, an information terminal of JP-A-2018-25768 also includes a similar display panel, and the brightness of the display is adjusted in accordance with the bending status of the display panel.

However, the strain sensors of the display panels in JP-A-2018-10293 and JP-A-2018-25768, detect bending as a trigger for display driving such as switching display, brightness adjustment, and the like. Then it was difficult to apply the strain sensors to detect the thickness of a liquid crystal layer. Additionally, in order to detect the thickness of a liquid crystal layer, it is desirable to provide a strain sensor inside a display panel, but such technology is not disclosed. Therefore, the strain of a display area was not detected. Therefore, an electro-optical device capable of detecting strain of the substrate in a display area has been desired.

SUMMARY

An electro-optical device including an electro-optical panel that includes a first strain sensor element including a first resistance member, a second strain sensor element including a second resistance member that are provided in a pixel area, and a first wiring electrically coupling the first strain sensor element and the second strain sensor element, a first variable resistance member, a second variable resistance member, and a second wiring electrically coupling the first variable resistance member and the second variable resistance member.

An electro-optical device including an electro-optical panel that includes a first strain sensor element including a first resistance member provided in a pixel area, a second strain sensor element including a second resistance member provided outside the pixel area along the pixel area, and a first wiring electrically coupling the first strain sensor element and the second strain sensor element, a first variable resistance member, a second variable resistance member, and a second wiring electrically coupling the first variable resistance member and the second variable resistance member.

An electronic apparatus includes the electro-optical device described above.

DESCRIPTION OF EXEMPLARY EMBODIMENTS

First Exemplary Embodiment

In the embodiment, an electro-optical apparatus including an active matrix type electro-optical panel is described. An active matrix type electro-optical panel includes a thin film transistor on an element configured to switch a pixel. A thin film transistor is referred as a TFT (Thin Film Transistor.) An electro-optical panel is used for, for example, a liquid crystal light valve as an optical modulation element of a liquid crystal projector as a projection-type display device.

Figure 1:
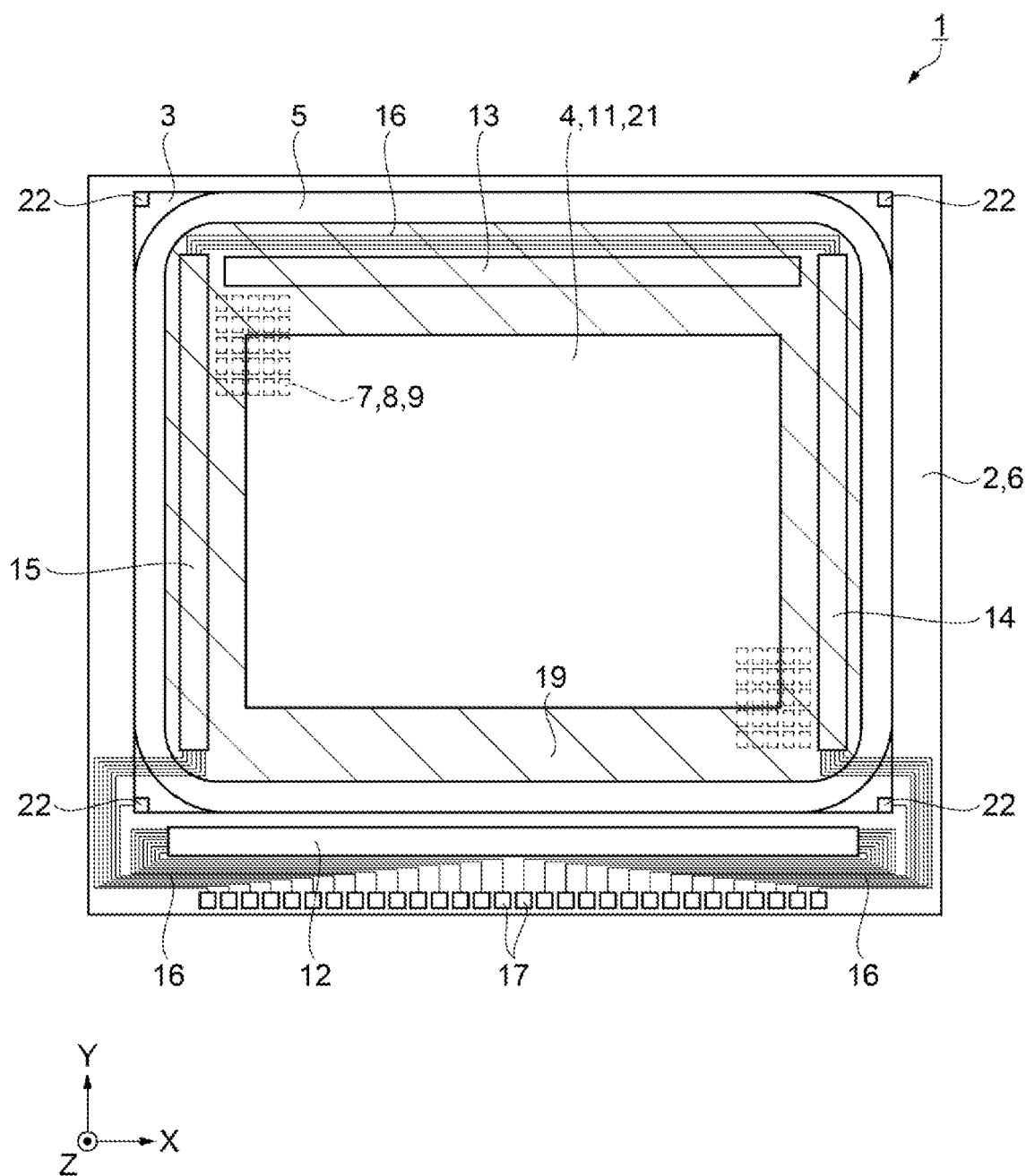
FIG. 1 is a schematic plan diagram illustrating a configuration of an electro-optical panel according to the first exemplary embodiment.
Figure 2:
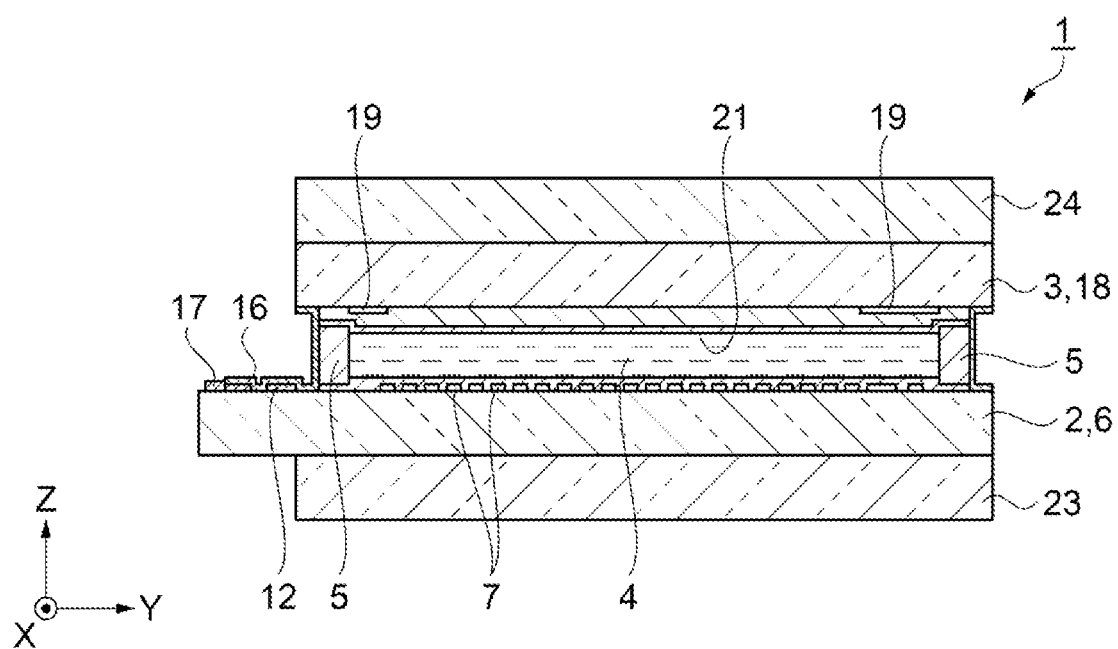
FIG. 2 is a schematic side cross-sectional view illustrating a configuration of an electro-optical panel.

As illustrated in FIGS. 1 and 2, the electro-optical panel 1 includes an element substrate 2 as a first substrate and a counter substrate 3 as a second substrate facing the element substrate 2. A liquid crystal layer 4, which is rectangular in plan view of the element substrate 2, is provided between the element substrate 2 and the counter substrate 3. A seal material 5 is provided surrounding the liquid crystal layer 4. The seal material 5 is provided between the element substrate 2 and the counter substrate 3. The seal material 5 adheres and fixes the element substrate 2 and the counter substrate 3. A direction oriented from the element substrate 2 toward the counter substrate 3 is +Z direction. Directions along two adjacent sides of the element substrate 2 are referred to as X direction and Y direction. In FIG. 1, the right side is +X direction and the upper side is +Y direction.

The element substrate 2 includes a first base material 6. A transparent substrate is used for the first base material 6. When viewed from +Z direction, the element substrate 2 is a substrate having a larger area than the counter substrate 3. A light-transmissive pixel electrode 7 and a thin film transistor 8 (TFT: Thin Film Transistor) are provided in a matrix shape on the +Z direction side surface of the first base material 6.

A display area 11 in which a plurality of pixels 9 is arrayed in a matrix shape is provided inside an inner edge of the seal material 5. A thin film transistor 8 and one pixel electrode 7 are provided in one pixel 9.

A data line drive circuit 12 is provided between the −Y direction side sideline of the element substrate 2 and the −Y direction side of the seal material 5. The inspection circuit 13 is provided between the +Y direction side of the display area 11 and the +Y direction side of the seal material 5. Furthermore, a first scanning line drive circuit 14 is provided between the +X direction side of the display area 11 and the +X direction side of the seal material 5. A second scanning line drive circuit 15 is provided between the −X direction side of the display area 11 and the −X direction side of the seal material 5. A wiring 16 that couples the first scanning line drive circuit 14 and the second scanning line drive circuit 15 is provided between the inspection circuit 13 and the +Y direction side of the seal material 5.

Connection terminals 17 are arranged along the sideline between the −Y direction side sideline of the element substrate 2 and the data line driving circuit 12. The data line drive circuit 12, the inspection circuit 13, the first scanning line drive circuit 14, and the second scanning line drive circuit 15 are coupled by connection terminals 17 and wiring 16.

The counter substrate 3 is provided with a second base material 18 that is rectangular in plan view. A transparent substrate is used for the second base material 18. A frame-shaped light shielding layer 19 is provided on the −Z direction side surface of the counter substrate 3. The light shielding layer 19 is provided on the inside of the seal material 5 so as to surround the display area 11. The light shielding layer 19 of FIG. 1 is hatched. A light shielding layer 19 is provided in a position overlapping with the inspection circuit 13, the first scanning line drive circuit 14, the second scanning line drive circuit 15, and a portion of the wiring 16 in plan view of the counter substrate 3 from +Z direction. The light shielding layer 19 blocks light incident on these circuits from the counter substrate 3 side and prevents circuits from malfunctioning due to the light. A light shielding layer 19 shields a stray light so that the stray light does not enter the display area 11. The light shielding layer 19 then increases the contrast of the display area 11.

A common electrode 21 is provided on −Z direction side surface of the counter substrate 3. A transparent conductive film, such as indium tin oxide (ITO) is used for the pixel electrode 21. First vertical conduction units 22 are disposed at four corners of the common electrode 21, and the first vertical conduction units 22 electrically couple the common electrode 21 and the wiring 16 on the element substrate 2 side.

As illustrated in FIG. 2, the first dust resistant substrate 23 is adhesively fixed to the −Z direction side surface of the element substrate 2. A second dust resistant substrate 24 is adhesively fixed to the +Z direction side surface of the counter substrate 3. The −Z direction side surface of the first dust resistant substrate 23 is exposed, so dust may adhere to the substrate. The +Z direction side surface of the second dust resistant substrate 24 is also exposed, so dust may adhere to the substrate. The electro-optical panel 1 is used in combination with an optical system such as a lens. The optics focus on the liquid crystal layer 4. Even when dust adheres to the first dust resistant substrate 23 and the second dust resistant substrate 24, by setting apart the liquid crystal layer 4 from there, the image of dust by the optics is blurred. Therefore, the first dust resistant substrate 23 and the second dust resistant substrate 24 make the effect of dust small on an image.

An adhesive is used to secure the element substrate 2 and the first dust resistant substrate 23 and to secure the counter substrate 3 and the second dust resistant substrate 24. The adhesive changes over time. The element substrate 2 and the counter substrate 3 are strained due to the effects of the changed adhesive and the like. Then, when the thickness of the liquid crystal layer 4 changes, color unevenness occurs in the image. By detecting the strain of the element substrate 2 or the counter substrate 3, it is possible to estimate the condition of the image for whether it tends to occur color unevenness or not.

Figure 3:
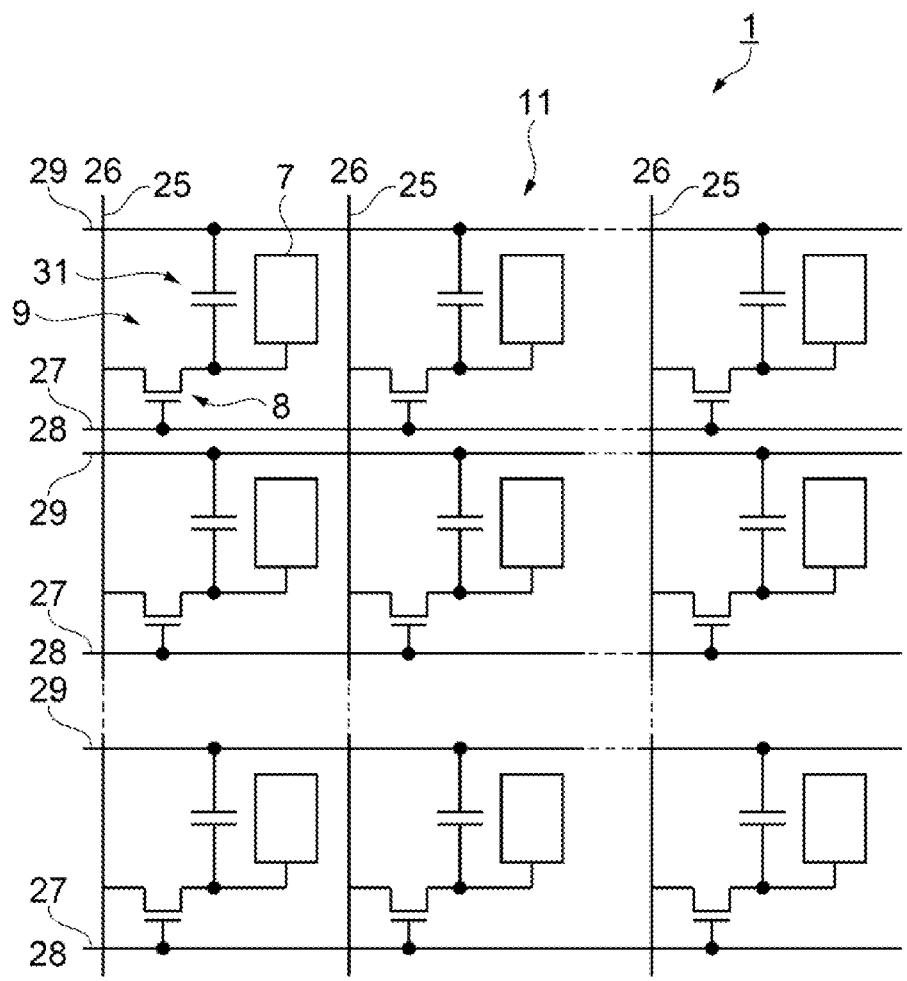
FIG. 3 is an equivalent circuit diagram illustrating an electrical configuration of an electro-optical panel.

As illustrated in FIG. 3, a plurality of pixels 9 is provided in a matrix shape in the display area 11. A pixel electrode 7 and a thin film transistor 8 are provided in each pixel 9. The source area of the thin film transistor 8 is electrically coupled to the data line 25 extending from the data line drive circuit 12. An image signal 26 is sequentially supplied to each data line 25 from the data line drive circuit 12. The gate electrode of the thin film transistor 8 is electrically coupled to the scanning line 27 extending from the first scanning line drive circuit 14 or the second scanning line drive circuit 15. A scanning signal 28 is sequentially supplied to each of the scanning lines 27 from the first scanning line drive circuit 14 or the second scanning line drive circuit 15. The drain region of a thin film transistor 8 is electrically coupled to a pixel electrode 7.

By turning on a thin film transistor 8 for a certain period of time, an image signal 26 is written to a pixel electrode 7 at a predetermined timing via the data line 25. The voltage level of the image signal applied to the liquid crystal layer 4 via a pixel electrode 7 is held for a period of time by the capacitance formed between the pixel electrode 7 and the common electrode 21 provided on the counter substrate 3.

In order to prevent the image signal 26 being held from leaking, a storage capacitor 31 is provided corresponding to a pixel electrode 7, and the storage capacitor 31 is provided in parallel with the liquid crystal capacitance. The storage capacitor 31 is electrically coupled to the capacitance line 29. In this way, a voltage signal is applied to the liquid crystal of each pixel 9. Since the alignment state of the liquid crystal changes in accordance with the applied voltage level, the light being incident on the liquid crystal layer 4 is modulated. Accordingly, a gradation display is enabled by the voltage signal. A data line 25, a scanning line 27, and a capacitance line 29 are formed from a light shielding material, and thus function as a light shielding member.

Figure 4:
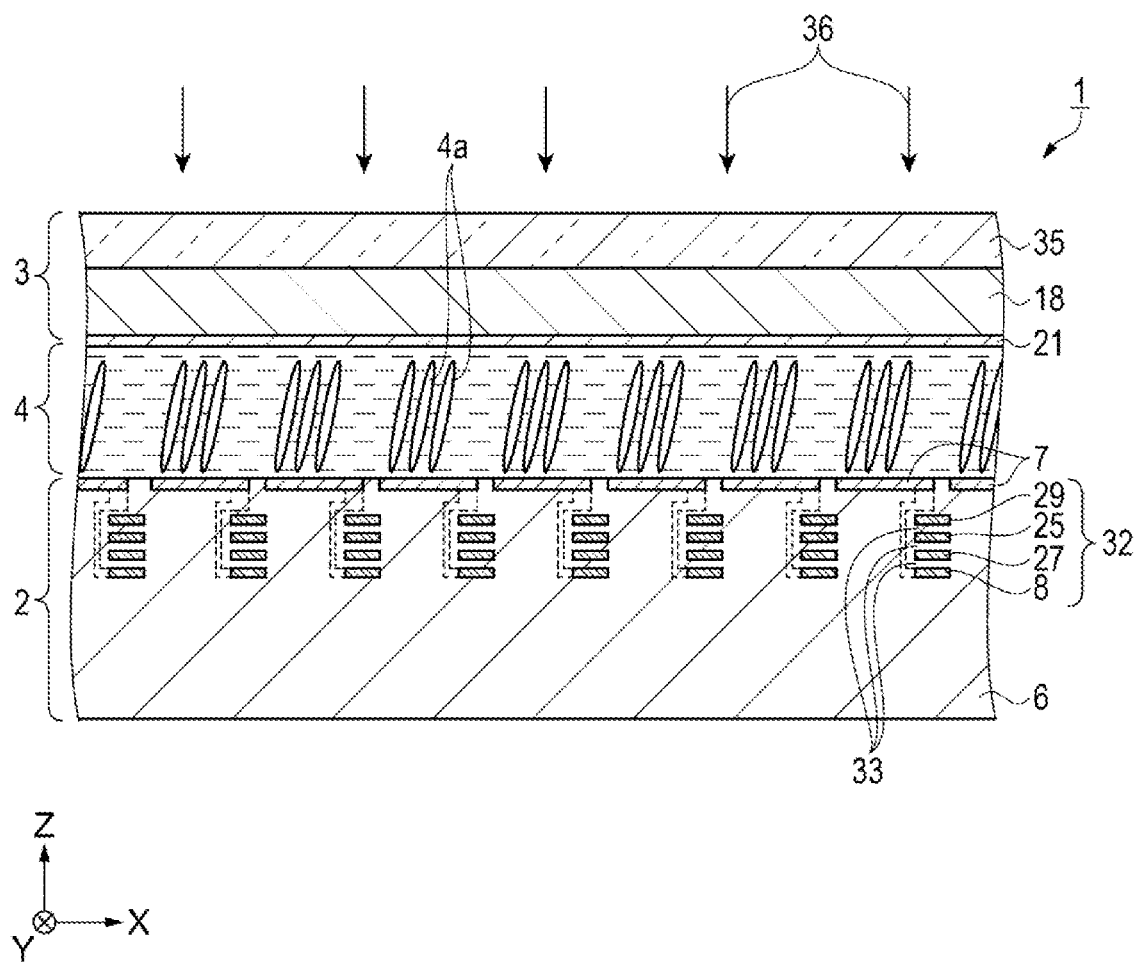
FIG. 4 is a schematic side cross-sectional view of a main portion illustrating a configuration of an electro-optical panel.

In the electro-optical panel 1, the element substrate 2 and the counter substrate 3 are bonded together by a seal material 5. As illustrated in FIG. 4, the liquid crystal layer 4 is sandwiched between the element substrate 2 and the counter substrate 3. In the drawing, a first dust resistant substrate 23 and a second dust resistant substrate 24 are omitted.

The element substrate 2 includes a first base material 6. The first base material 6 is a quartz substrate including silicon oxide. A light shielding member 32 is provided on the +Z direction side of the first base material 6. The light shielding member 32 is provided such that the interlayer insulating layers 33 are sandwiched between a lower light shielding layer (not illustrated) disposed between the thin film transistor 8 and the first base material 6, a data line 25, a scanning line 27, a capacitance line 29, and the like. A lower light shielding layer (not illustrated), a data lines 25, a scanning line 27, and a capacitance line 29 are provided so as to overlap with the thin film transistor 8. In plan view toward to the element substrate 2, the data lines 25, the scanning lines 27, and the capacitance lines 29 are arranged in a lattice shape, and regions surrounded by the data lines 25, the scanning lines 27, and the capacitance lines 29 are provided with the same silicon oxide as that of the interlayer insulating layers 33.

A pixel electrode 7 is provided on the +Z direction side of the light shielding member 32. A capacitance line 29 is provided between the pixel electrode 7 and the data line 25. A light shielding member 32 includes a relay layer that electrically couples the drain of the thin film transistor 8 and a pixel electrode 7.

A liquid crystal layer 4 is provided on the +Z direction side of the pixel electrode 7. A counter substrate 3 is provided on the +Z direction side of the liquid crystal layer 4. An inorganic alignment film is formed on the liquid crystal layer 4 side surface of the element substrate 2 and the counter substrate 3. The inorganic alignment film is a diagonally vapor-deposited film. A lot of pillars that are inclined with respect to the +Z direction are formed on the surface of the inorganic alignment film.

The liquid crystal layer 4 includes a large number of liquid crystal molecules 4a. The longitudinal axis direction of the liquid crystal molecules 4a is provided to incline at approximately 5 degrees with respect to the +Z direction by the inorganic oriented film. In this way, the electro-optical panel 1 is constituted as a liquid crystal device of a Vertical Alignment (VA) mode.

In the counter substrate 3, a common electrode 21 is provided on the surface facing −Z direction side of the second base material 18. The common electrode 21 is a light-transmissive film such as an ITO film. The common electrode 21 is formed on the entire surface of the display area 11 of the counter substrate 3. The common electrode 21 is covered with the inorganic alignment film. An optical compensation plate 35 is provided on the +Z direction side of the second base material 18. In the optical compensation plate 35, a silicon oxide layer and a silicon nitride layer are stacked. Optical compensation plate 35 modulates the phase of light 36. Light 36 enters from the counter substrate 3 side. The light 36 passes through the counter substrate 3, the liquid crystal layer 4, and the element substrate 2.

Figure 5:
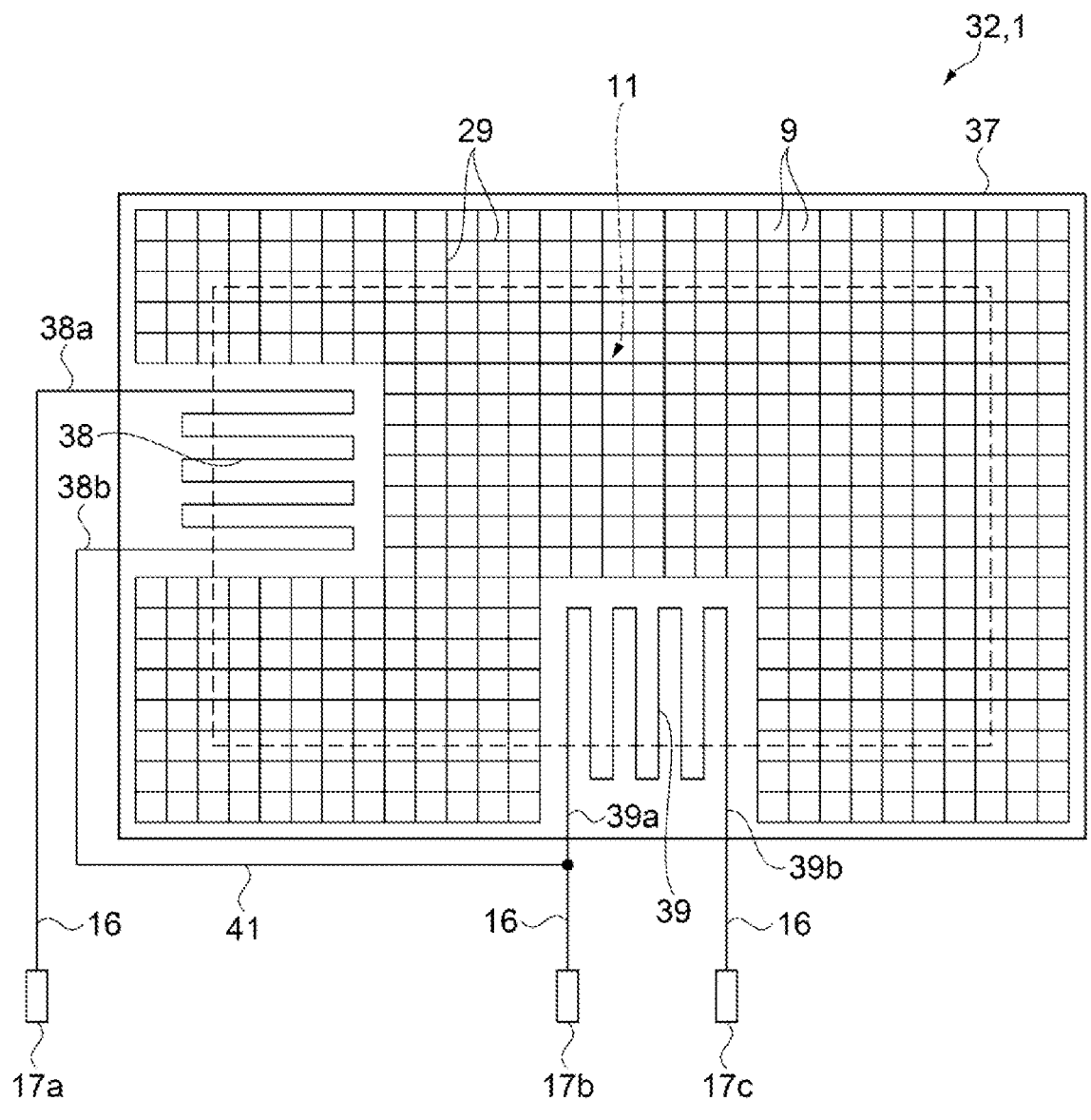
FIG. 5 is a schematic plan diagram of a main portion illustrating the arrangement of strain sensors.

As illustrated in FIG. 5, a capacitance line 29 that surrounds a pixel 9 and is part of the light shielding member 32 extends in the X direction and the Y direction. The region where a pixel 9 is provided is referred to as a pixel area 37. A portion other than the display area 11 in the pixel area 37 is light-shielded by the light shielding layer 19.

A first strain sensor element 38 including a first resistance member is provided on the −X direction side in the pixel area 37. A second strain sensor element 39 including a second resistance member is provided on the −Y direction side in the pixel area 37. The first end 38a of the first strain sensor element 38 is electrically coupled to the first terminal 17a by wiring 16. The second end 38b of the first strain sensor element 38 and the third end 39a of the second strain sensor element 39 are electrically coupled by the first wiring 41. The first wiring 41 is electrically coupled to the second terminal 17b by wiring 16. The fourth end 39b of the second strain sensor element 39 is electrically coupled to the third terminal 17c by wiring 16. The first terminal 17a, the second terminal 17b, and the third terminal 17c are part of the connection terminal 17.

The +X direction is a first direction 42. The +Y direction is a second direction 43. A second direction 43 is orthogonal to the first direction 42. The first strain sensor element 38 is provided along the pixel 9 arranged in the first direction 42 of the pixel area 37. The second strain sensor element 39 is provided along the pixel 9 arranged in the second direction 43. The first strain sensor element 38 and the second strain sensor element 39 are provided along mutually intersecting directions. Therefore, the difference in strain in the intersecting directions can be detected.

The first strain sensor element 38 and the second strain sensor element 39 are provided on the element substrate 2 of the electro-optical panel 1. The first strain sensor element 38 and the second strain sensor element 39 can efficiently detect strain of the element substrate 2.

The first strain sensor element 38 and the second strain sensor element 39 are provided in the same layer as the capacitance line 29. The first strain sensor element 38 and the second strain sensor element 39 are provided in the layer between a data lines 25 and a pixel electrode 7. The material of a first resistance member and a second resistance member is electrically conductive, and there is a negative correlation between the cross-sectional area and the resistance value. As the cross-sectional area decreases when the first strain sensor element 38 and the second strain sensor element 39 extend due to stress, the resistance value increases. Further, a first strain sensor element 38 and a second strain sensor element 39 include a light shielding material. In the embodiment, for example, aluminum is included in a first resistance member, a second resistance member, and a capacitance line 29.

The first strain sensor element 38 and the second strain sensor element 39 shield light 36. Therefore, the structure can be simplified compared to the case where the light shielding layer is provided separately from the first strain sensor element 38 and the second strain sensor element 39. In addition, since the first strain sensor element 38, the second strain sensor element 39, and capacitance lines 29 are respectively provided in the same layer and applied a constant potential respectively. Therefore, it is facilitated to switch between a general driving for a display and detecting strain.

The first strain sensor element 38 and the second strain sensor element 39 may be provided only in the display area 11. The first strain sensor element 38 and the second strain sensor element 39 may be provided as protruding from the display area 11 in addition to in the display area 11.

Figure 6:
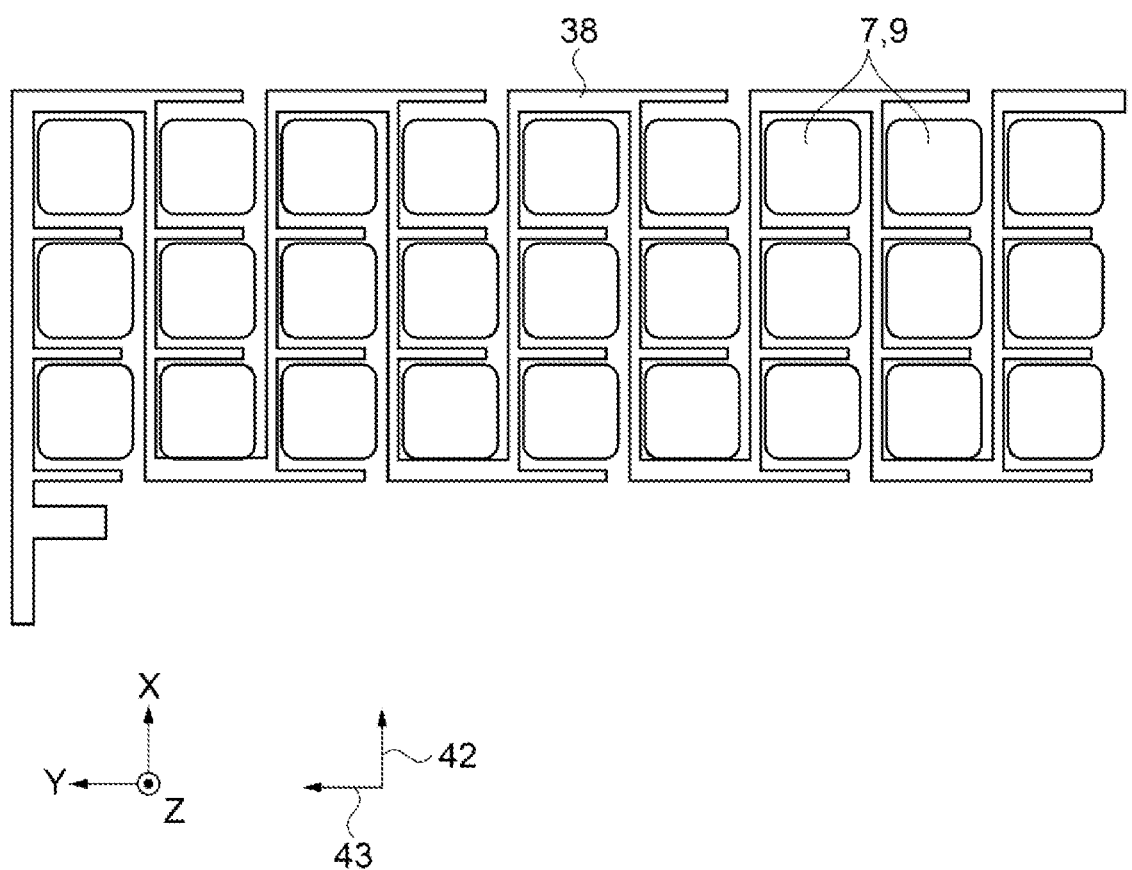
FIG. 6 is a schematic plan diagram of a main portion illustrating the arrangement of a strain sensor.

As illustrated in FIG. 6, the first strain sensor element 38 is provided between adjacent pixel electrodes 7 in the same manner as the capacitance line 29. A storage capacitor 31 is formed between the pixel electrode 7 and the first strain sensor element 38. Similar to the first strain sensor element 38, a second strain sensor element 39 is also provided between adjacent pixel electrodes 7. A storage capacitor 31 is also formed between the pixel electrode 7 and the second strain sensor element 39.

Figure 7:
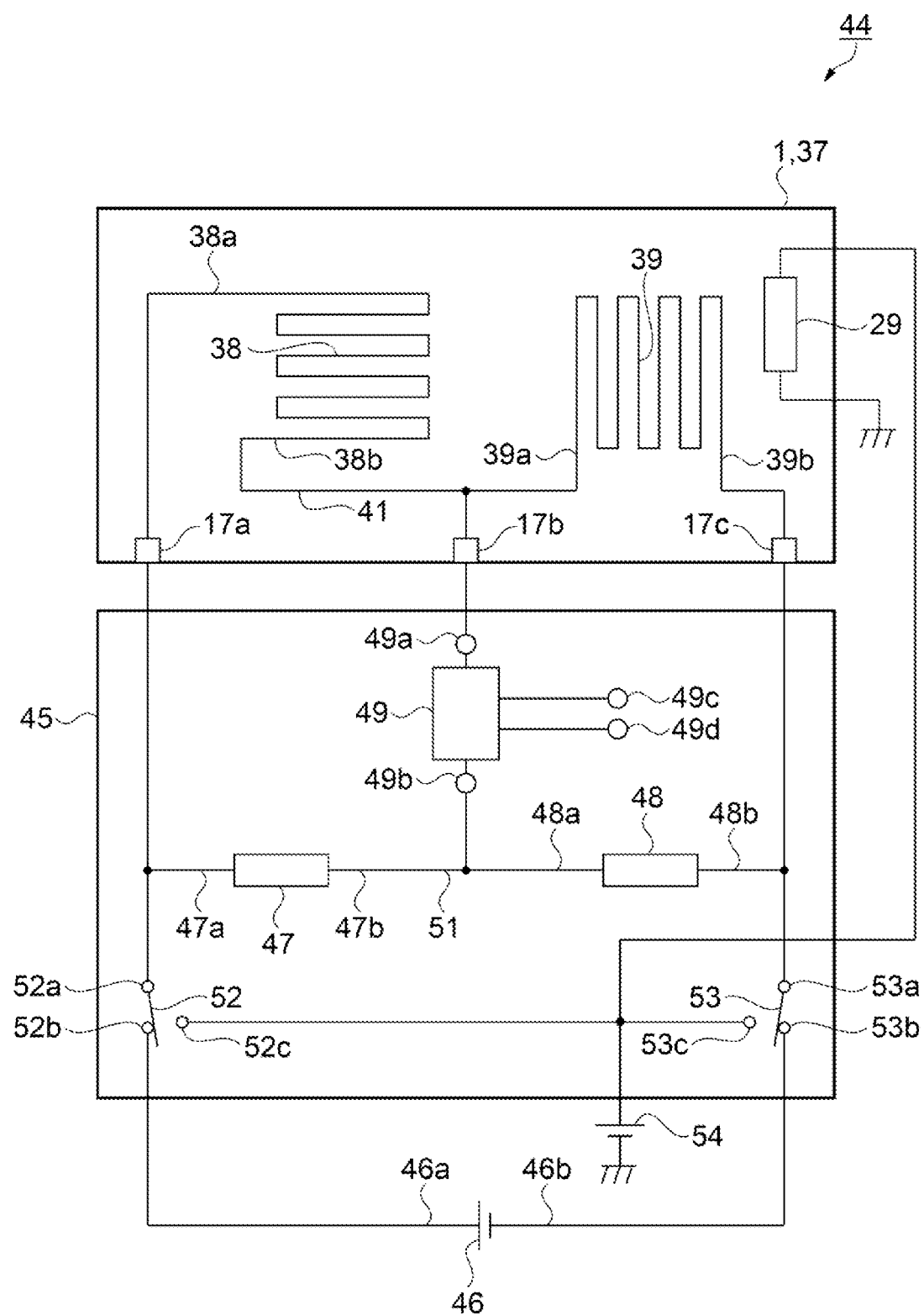
FIG. 7 is a circuit diagram illustrating an electrical configuration of a strain detection circuit.

As illustrated in FIG. 7, the electro-optical device 44 includes an electro-optical panel 1, a strain detection circuit 45, and a first power supply 46. The strain detection circuit 45 includes a first variable resistance member 47, a second variable resistance member 48, and a galvanometer 49. The first variable resistance member 47 and the second variable resistance member 48 are electrically coupled by the second wiring 51. The sixth end 47b of the first variable resistance member 47 is electrically coupled to the seventh end 48a of the second variable resistance member 48.

The strain detection circuit 45 is provided with a first switch 52 and a second switch 53. The first switch terminal 52a of the first switch 52 is electrically coupled to the first terminal 17a and the fifth end 47a of the first variable resistance member 47. The second switch terminal 52b of the first switch 52 is electrically coupled to the positive electrode 46a of the first power supply 46. The third switch terminal 52c of the first switch 52 is electrically coupled to the second power supply 54.

The fourth switch terminal 53a of the second switch 53 is electrically coupled to the third terminal 17c and the eighth end 48b of the second variable resistance member 48. The fifth switch terminal 53b of the second switch 53 is electrically coupled to the negative electrode 46b of the first power supply 46. The sixth switch terminal 53c of the second switch 53 is electrically coupled to the second power supply 54. The second power supply 54 is a power source configured to apply a constant potential to the capacitance lines 29.

When the first strain sensor element 38 and the second strain sensor element 39 detect strain of the electro-optical panel 1, the first switch terminal 52a and the second switch terminal 52b are electrically coupled, and the fourth switch terminal 53a and the fifth switch terminal 53b are electrically coupled. Thus, the fifth end 47a of the first variable resistance member 47 is electrically coupled to the first end 38a of the first strain sensor element 38 and the positive electrode 46a of the first power source 46, and the eighth end 48b of the second variable resistance member 48 is electrically coupled to the fourth end 39b of the second strain sensor element 39 and the negative electrode 46b of the first power supply 46. A constant potential is applied by the first power supply 46 to the first end 38a of the first strain sensor element 38 and the fourth end 39b of the second strain sensor element 39.

The resistance values of the first variable resistance member 47 and the second variable resistance member 48 are adjusted in the manufacturing process. Specifically, the resistance ratio between the first strain sensor element 38 and the second strain sensor element 39 is adjusted to be the same as the resistance ratio of the first variable resistance member 47 and the second variable resistance member 48. At this time, the current flowing into the galvanometer 49 becomes zero.

The galvanometer 49 includes a coil and detects current flowing in the coil. The current value detected by the galvanometer 49 is output to the first flow terminal 49c and the second flow terminal 49d. The galvanometer 49 may include a resistance with a low resistance value. The galvanometer 49 may convert the current flowing through the resistance into a voltage and output to the first flow terminal 49c and the second flow terminal 49d.

When the first strain sensor element 38 and the second strain sensor element 39 do not detect strain of the electro-optical panel 1, the first switch terminal 52a and the third switch terminal 52c are electrically coupled, and the fourth switch terminal 53a and the sixth switch terminal 53c are electrically coupled. Thus, the first strain sensor element 38 and the second strain sensor element 39 are applied with the potential of the same constant potential as the potential supplied to the capacitance line 29.

In the electro-optical panel 1, the first strain sensor element 38 and the second strain sensor element 39 are electrically coupled by the first wiring 41. In the strain detection circuit 45, the first variable resistance member 47 and the second variable resistance member 48 are electrically coupled by the second wiring 51. The Wheatstone bridge circuit is then configured. The galvanometer 49 detects a current generated by the potential difference between the potential applied to the first wiring 41 and the potential applied to the second wiring 51. By detecting the current flowing between the first wiring 41 and the second wiring 51, the resistance ratio of the first strain sensor element 38 and the second strain sensor element 39 is detected. The first strain sensor element 38 and the second strain sensor element 39 are provided in the pixel area 37, and then the galvanometer 49 is capable of detecting strain in the pixel area 37.

A ninth terminal 49a of the galvanometer 49 is electrically coupled to the first wiring 41. A tenth terminal 49b of the galvanometer 49 is electrically coupled to the second wiring 51. The galvanometer 49 detects the current flowing between the first wiring 41 and the second wiring 51. This current is correlated with the resistance ratio between the first strain sensor element 38 and the second strain sensor element 39. Accordingly, strain at a location where the first strain sensor element 38 and the second strain sensor element 39 are installed can be easily detected by the galvanometer 49.

A constant potential is applied to the first strain sensor element 38 and the second strain sensor element 39. The data line 25 and the pixel electrode 7 can be electrically shielded by the first strain sensor element 38 and the second strain sensor element 39.

Second Exemplary Embodiment

Figure 8:
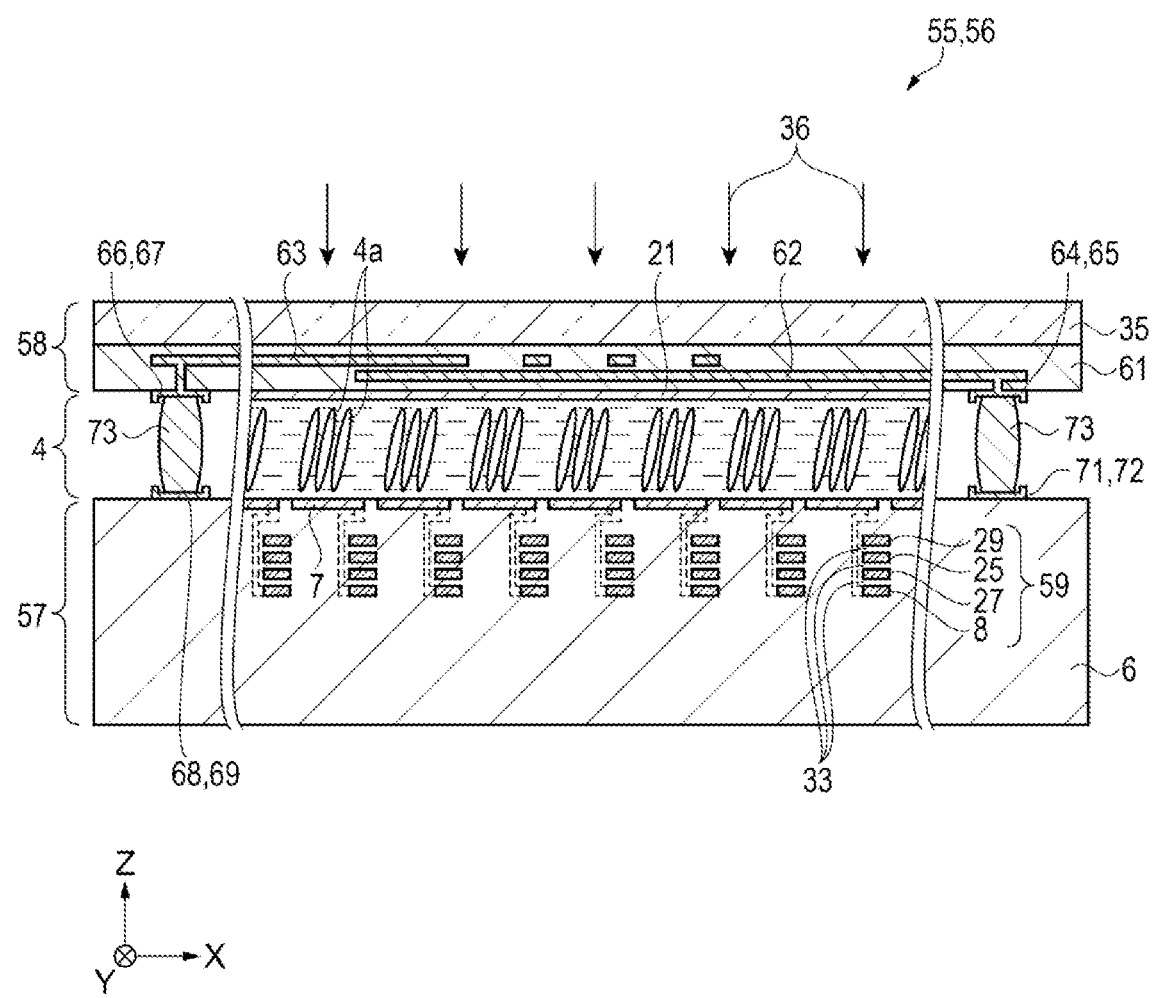
FIG. 8 is a schematic side cross-sectional view illustrating a configuration of an electro-optical panel according to the second exemplary embodiment.

The same configuration as the configuration in first exemplary embodiment is denoted by the same reference signs, and descriptions of such constituent elements will be omitted. As illustrated in FIG. 8, in the electro-optical panel 56 of the electro-optical device 55, the liquid crystal layer 4 is sandwiched by the element substrate 57 as a second substrate and the counter substrate 58 as a first substrate. A light shielding member 59 is provided on the element substrate 57. In the first exemplary embodiment, the first strain sensor element 38 and the second strain sensor element 39 are provided in the same layer as the capacitance line 29 in the light shielding g member 32. In the embodiment, the first strain sensor element 38 and the second strain sensor element 39 are not provided in the light shielding member 59. In the first exemplary embodiment, a capacitance line 29 is provided where the first strain sensor element 38 and the second strain sensor element 39 were provided.

The counter substrate 58 includes a second base material 61. A first strain sensor element 62 and a second strain sensor element 63 are provided between the second substrate 61 and the common electrode 21. The counter substrate 58 includes a first electrode 64, a second electrode 65, a third electrode 66, and a fourth electrode 67 on −Z direction side surface. The first electrode 64 and the second electrode 65 are electrically coupled to the first strain sensor element 62. The third electrode 66 and the fourth electrode 67 are electrically coupled to the second strain sensor element 63.

The element substrate 57 is provided with the fifth electrode 68, the sixth electrode 69, the seventh electrode 71, and the eighth electrode 72 on the +Z direction side surface. The fifth electrode 68, the sixth electrode 69, the seventh electrode 71, and the eighth electrode 72 are electrically and respectively coupled to the first electrode 64, the second electrode 65, the third electrode 66, the fourth electrode 67 by the second vertical conduction units 73. The fifth electrode 68, the sixth electrode 69, the seventh electrode 71, and the eighth electrode 72 are electrically coupled to the first terminal 17a, the second terminal 17b, and the third terminal 17c, which are connection terminals 17 by wiring 16.

Figure 9:
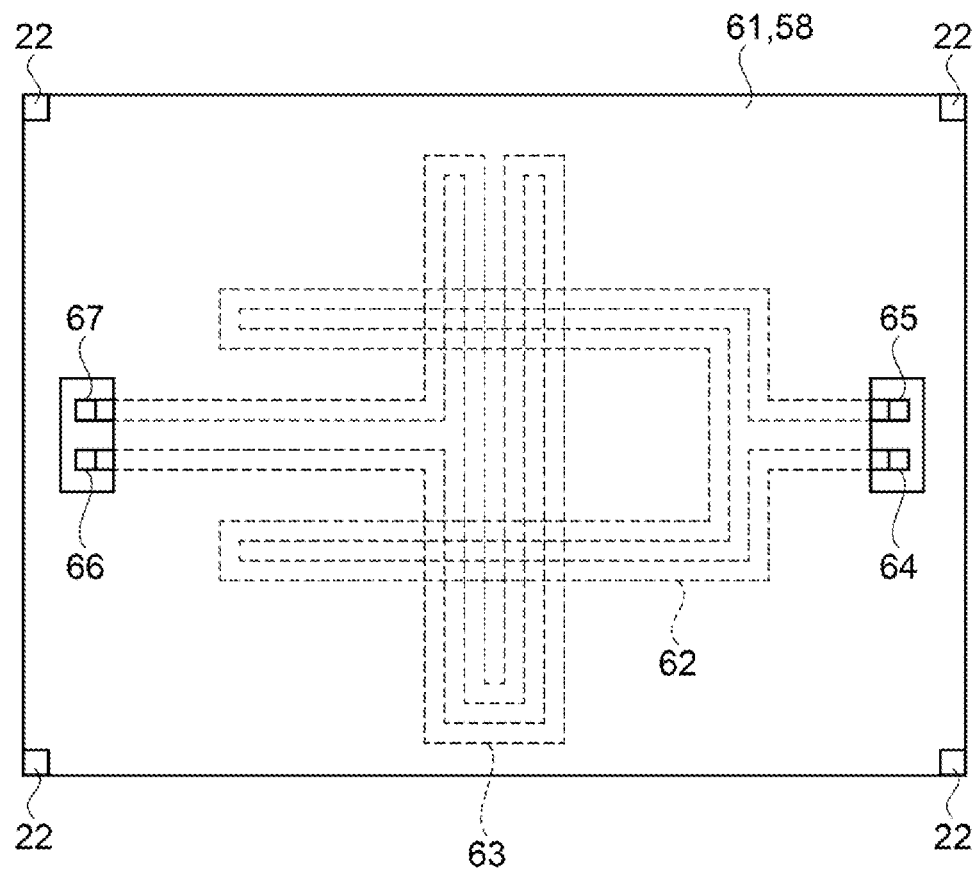
FIG. 9 is a schematic plan diagram illustrating the arrangement of strain sensors.

As illustrated in FIG. 9, the first strain sensor element 62 is provided with a first resistance member that is long along the first direction 42. The first strain sensor element 62 detects a strain of the counter substrate 58 in X direction. The second strain sensor element 63 is provided with a second resistance member that is long along the second direction 43. The second strain sensor element 63 detects a strain in the Y direction of the counter substrate 58. The first strain sensor element 62 and the second strain sensor element 63 can detect the difference in strain in the intersecting direction. The first strain sensor element 62 and the second strain sensor element 63 can detect the strain of the provided counter substrate 58.

Third Exemplary Embodiment

Figure 10:
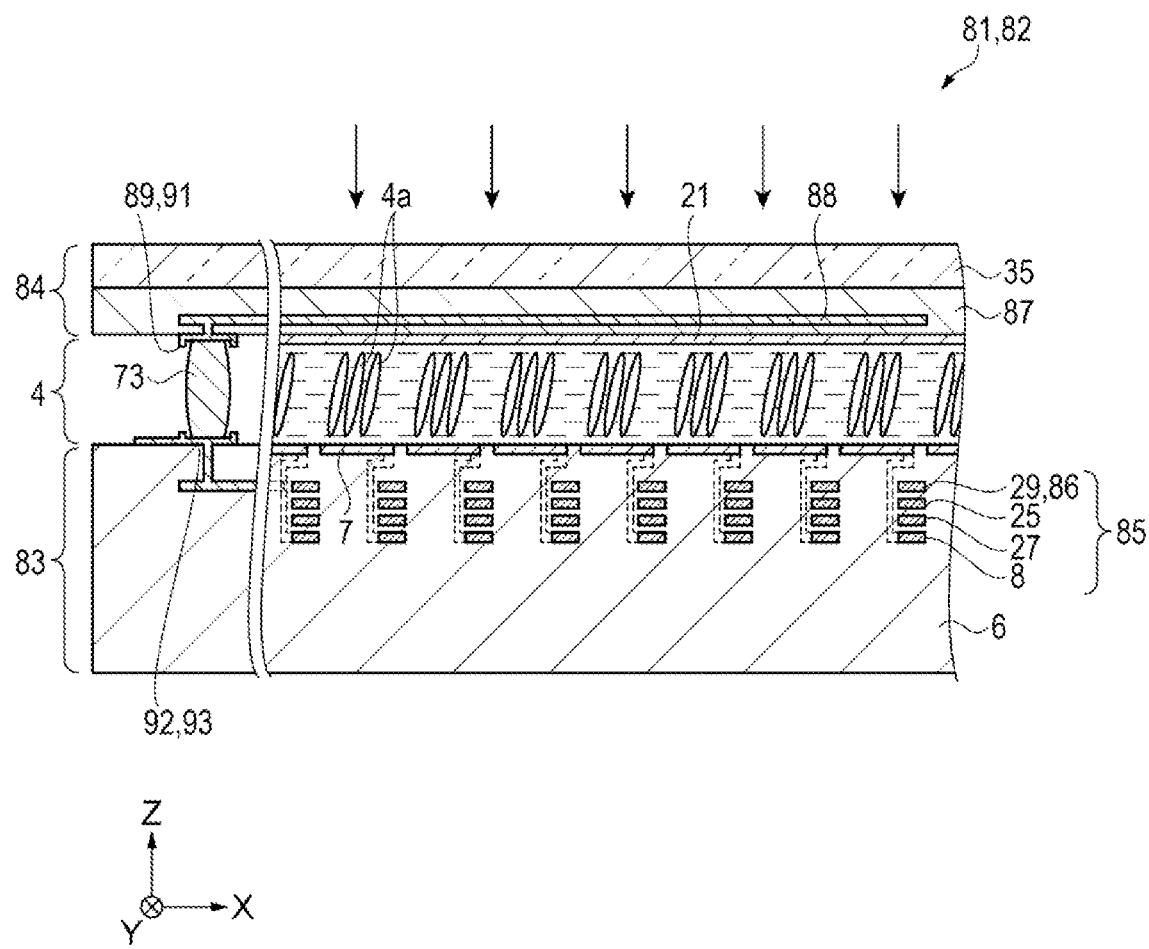
FIG. 10 is a schematic side cross-sectional view illustrating a configuration of an electro-optical panel according to the third exemplary embodiment.

The same configuration as the configuration in the first exemplary embodiment is denoted by the same reference signs, and descriptions of such constituent elements will be omitted. As illustrated in FIG. 10, in the electro-optical panel 82 of the electro-optical device 81, the liquid crystal layer 4 is sandwiched by the element substrate 83 as a first substrate and the counter substrate 84 as a second substrate. A light shielding member layer 85 is provided in the element substrate 83. In the first exemplary embodiment, the first strain sensor element 38 and the second strain sensor element 39 are provided in the same layer as the capacitance line 29 in the light shielding g member 32. In the light shielding member layer 85, the first strain sensor element 86 is provided in the same layer as the capacitance line 29, but the second strain sensor element 39 is not provided. A first strain sensor element 86 is provided on the element substrate 83 of the electro-optical panel 82.

The counter substrate 84 includes a second base material 87. A common electrode 21 and the second strain sensor element 88 are provided between the second substrate 87 and the liquid crystal layer 4. In other words, the second strain sensor element 88 is provided in the counter substrate 84 of the electro-optical panel 82. A ninth electrode 89 as the electrode for the strain sensor element and a tenth electrode 91 as the electrode for the strain sensor element are included between the second substrate 87 and the second vertical conduction unit 73, on the –Z direction side surface of the second substrate 87. A ninth electrode 89 and a tenth electrode 91 are electrically coupled to the second strain sensor element 88.

In the thickness direction of the element substrate 83, the first strain sensor element 86 and the second strain sensor element 88 are provided separated from each other. The difference in strain detected by the first strain sensor element 86 and the second strain sensor element 88 is greater when the first strain sensor element 86 and the second strain sensor element 88 are separated each other than when they are closer to each other. Accordingly, the strain of the electro-optical panel 82 can be efficiently detected.

The element substrate 83 is provided with an eleventh electrode 92 and a twelfth electrode 93 on the +Z direction side surface. The eleventh electrode 92 and the twelfth electrode 93 are electrically coupled to the ninth electrode 89 and the tenth electrode 91, respectively, via the second vertical conduction unit 73.

Figure 11:
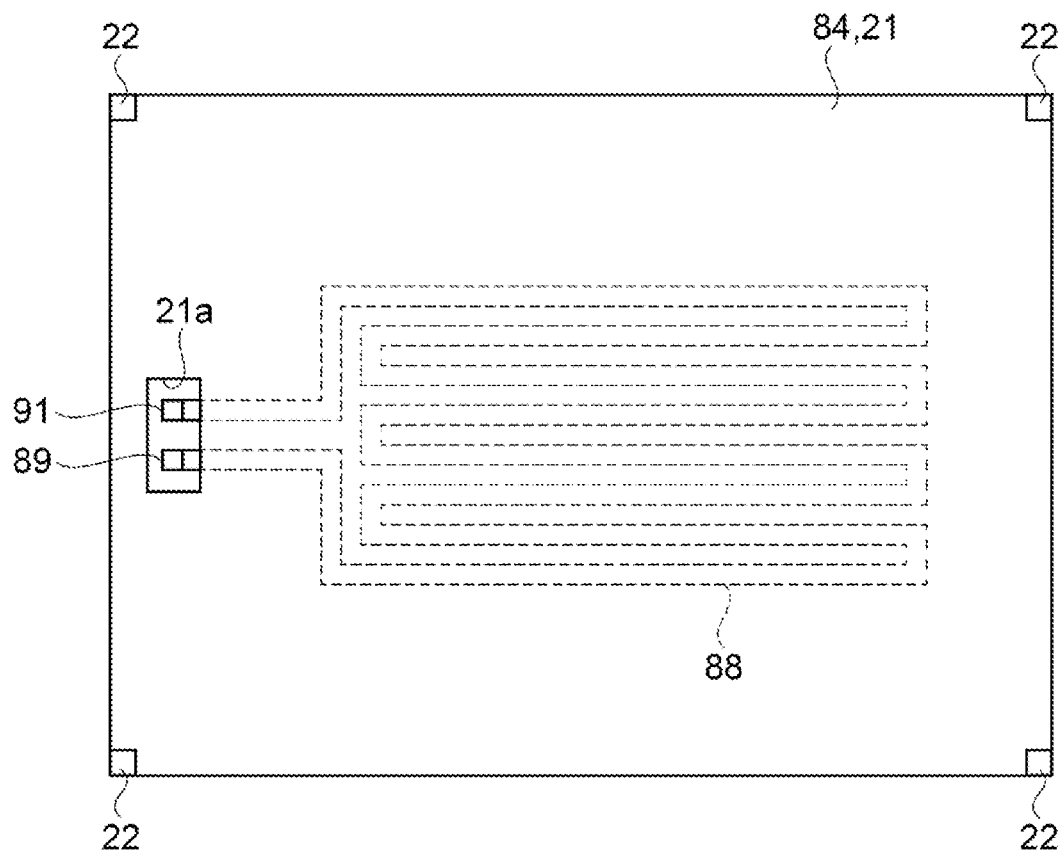
FIG. 11 is a schematic plan diagram of a main portion illustrating the arrangement of a strain sensor.

As illustrated in FIG. 11, the second strain sensor element 88 is provided with a second resistance member that is long in the first direction 42. The second strain sensor element 88 detects the strain in the X direction of the counter substrate 84. On the counter substrate 84, a ninth electrode 89 and a tenth electrode 91 electrically coupled to the second strain sensor element 88 are provided in the opening portion 21a of the common electrode 21.

Figure 12:
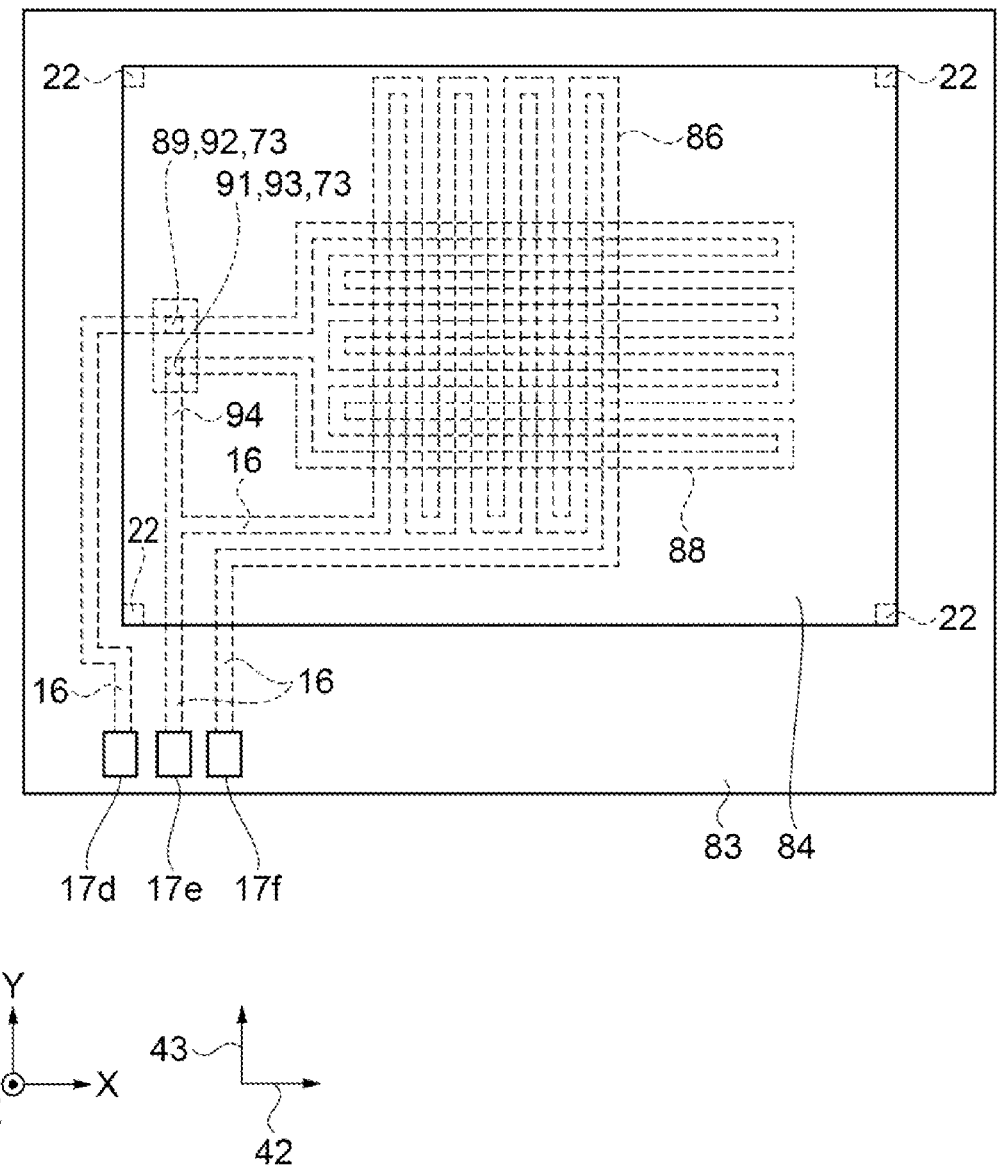
FIG. 12 is a schematic plan diagram of a main portion illustrating the arrangement of strain sensors.

As shown in FIG. 12, the eleventh electrode 92 is electrically coupled to the second strain sensor element 88 via the second vertical conducting portion 73 and the ninth electrode 89. The twelfth electrode 93 is electrically coupled to the second strain sensor element 88 via the second vertical conductive portion 73 and the tenth electrode 91. The first strain sensor element 86 and the second strain sensor element 88 are electrically coupled by the first wiring 94.

The element substrate 83 includes a fourth terminal 17d, and a fifth terminal 17e and a sixth terminal 17f as a terminal for a strain sensor element. The fourth terminal 17d is electrically coupled to the eleventh electrode 92 by the wiring 16. The fifth terminals 17e is electrically coupled to the twelfth electrode 93 and the first strain sensor element 86 by the wiring 16 and the first wiring 94. The fifth terminal 17e is electrically coupled to the tenth electrode 91 and also electrically coupled to the first strain sensor element 86. The sixth terminal 17f is electrically coupled to the first strain sensor element 86 by wiring 16.

The fifth terminal 17e and the tenth electrode 91 are electrically coupled. At this time, the fifth terminal 17e is electrically coupled to the first strain sensor element 86 and the second strain sensor element 88. Accordingly, the second strain sensor element 88 of the counter substrate 84 and the first strain sensor element 86 of the element substrate 83 can be electrically coupled in a simple configuration by the second vertical conduction unit 73 and the first wiring 94.

Forth Exemplary Embodiment

Figure 13:
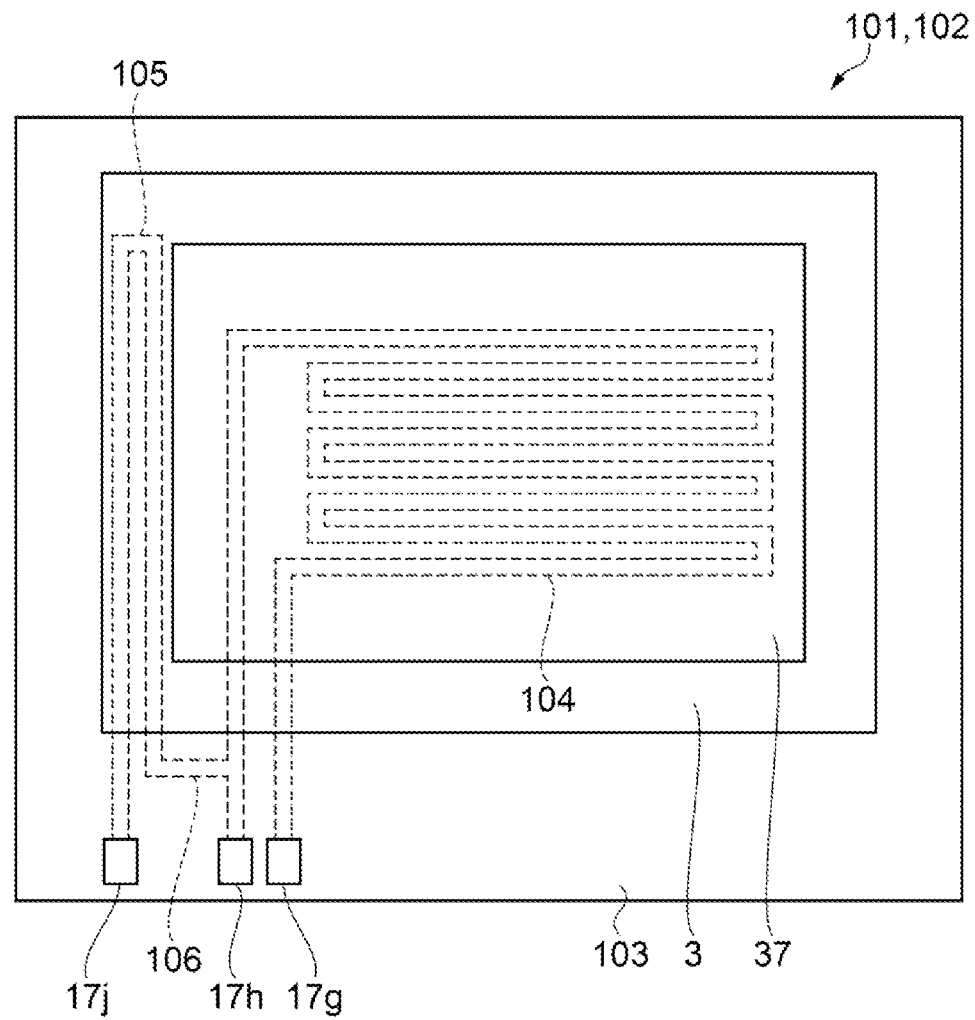
FIG. 13 is a schematic plan diagram of a main portion illustrating the arrangement of strain sensors according to the fourth exemplary embodiment.

The same configuration as the configuration in the first exemplary embodiment is denoted by the same reference signs, and descriptions of such constituent elements will be omitted. As illustrated in FIG. 13, in the electro-optical panel 102 of the electro-optical device 101, the liquid crystal layer 4 is sandwiched between the element substrate 103 as a first substrate and the counter substrate 3. The element substrate 103 is provided with a first strain sensor element 104 including a first resistance member in the pixel area 37. A second strain sensor element 105 including a second resistance member along the pixel area 37 is provided outside the pixel area 37. The first wiring 106 electrically couples the first strain sensor element 104 and the second strain sensor element 105.

The element substrate 103 is provided with a seventh terminal 17g, an eighth terminal 17h, and a ninth terminal 17j. The seventh terminal 17g is electrically coupled to the first strain sensor element 104. The eighth terminal 17h is electrically coupled to the first wiring 106. The ninth terminal 17j is electrically coupled to the second strain sensor element 105.

The electro-optical device 101 includes the strain detection circuit 45 and the first power supply 46 illustrated in FIG. 7. A seventh terminal 17g is electrically coupled to the positive electrode 46a of the first power supply 46 and the fifth end 47a of the first variable resistance member 47. An eighth terminal 17h is electrically coupled to the ninth terminal 49a of the galvanometer 49. The ninth terminal 17j is electrically coupled to the negative electrode 46b of the first power supply 46 and the eighth end 48b of the second variable resistance member 48.

The location where the second strain sensor element 105 is provided is outside of the pixel area 37 and has little strain. Accordingly, it is possible to increase the degree of freedom of the layout of wiring or the like in the pixel area 37 while detecting the strain at the location where the first strain sensor element 104 is provided.

Fifth Exemplary Embodiment

Figure 14:
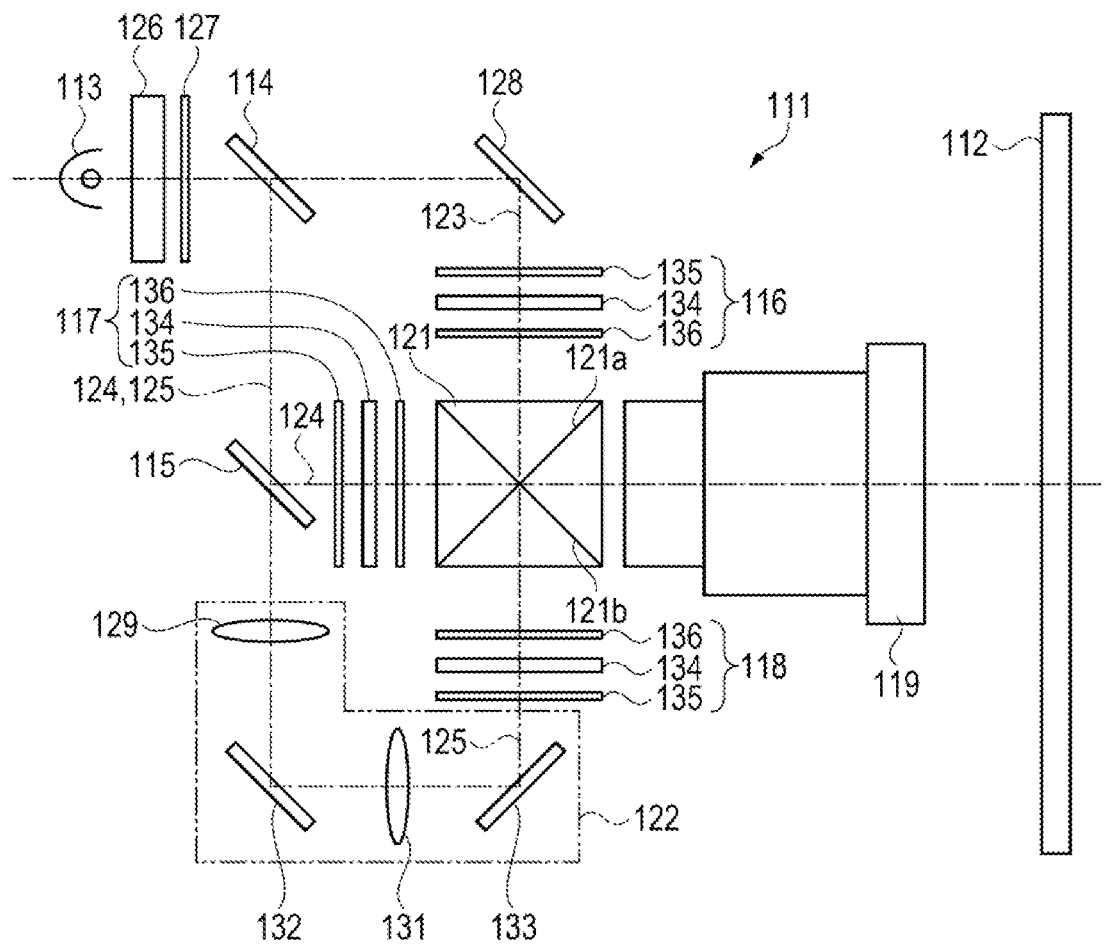
FIG. 14 is a schematic configuration diagram illustrating an optical system of a projector according to a fifth embodiment.

As illustrated in FIG. 14, a projection-type display device 111 as an electronic apparatus is a forward projection type projector configured to project an image on a screen 112 provided anteriorly. The projection-type display apparatus 111 includes a light source unit 113, a first dichroic mirror 114, a second dichroic mirror 115, a red light valve 116, a green light valve 117, a blue light valve 118, a projection optical system 119, a cross dichroic prism 121, and a relay optical system 122.

The light source unit 113 includes an extra-high-pressure mercury lamp configured to supply a light source light including red light, green light, and blue light, for example. The first dichroic mirror 114 transmits red light 123 from the light source unit 113, and reflects the green light 124 and blue light 125. The second dichroic mirror 115 transmits the blue light 125 and reflects the green light 124, in the green light 124 and the blue light 125 reflected from the first dichroic mirror 114. The first dichroic mirror 114 and the second dichroic mirror 115 separate the light emitted from the light source unit 113 into red light 123, green light 124 and blue light 125. An integrator 126 and a polarization converting element 127 are provided between the first dichroic mirror 114 and the light source light 113. The integrator 126 equalizes the illuminance distribution of the light irradiated from the light source unit 113. The polarization conversion element 127 converts the light from the light source unit 113 into linearly polarized light having a specific vibration direction such as s-polarized light.

The red light valve 116 modulates the red light 123, which passed through the dichroic mirror 114 and is reflected by a reflection mirror 128, in accordance with image signals. The red light valve 116 exits modulated red light 123 to the cross dichroic prism 121.

The green light valve 117 modulates the green light 124, reflected by the first dichroic mirror 114 and subsequently reflected by the second dichroic mirror 115, in accordance with image signals. The green light valve 117 exits modulated green light 124 toward the cross dichroic prism 121.

The blue light 125 is reflected by the first dichroic mirror 114 and passes through the second dichroic mirror 115. The blue light 125 is incident on the blue light valve 118 through the relay optical system 122. The blue light valve 118 modulates the blue light 125 in accordance with image signals. The blue light valve 118 exits modulated blue light 125 toward the cross dichroic prism 121.

The relay optical system 122 includes a first relay lens 129, a second relay lens 131, a first reflection mirror 132, and a second reflection mirror 133. The first relay lens 129 and the second relay lens 131 prevent optical loss of blue light 125. A first relay lens 129 is provided between the second dichroic mirror 115 and the first reflection mirror 132.

A second relay lens 131 is provided between the first reflection mirror 132 and the second reflection mirror 133. The blue light 125 passes through the second dichroic mirror 115 and the first relay lens 129 and is reflected by the first reflection mirror 132. Next, the blue light 125 passes through the second relay lens 131 and is reflected by the second reflection mirror 133. The blue light 125 then travels toward the blue light valve 118.

The cross dichroic prism 121 serves as a color synthesizing optical system in which a first dichroic film 121a and a second dichroic film 121b are orthogonally arranged in an X shape. The first dichroic film 121a reflects the blue light 125 and transmits the green light 124. The second dichroic film 121b reflects the red light 123 and transmits the green light 124.

The cross dichroic prism 121 synthesizes the red light 123, the green light 124, and the blue light 125 to exit toward the projection optical system 119. The projection optical system 119 projects the light synthesized by the cross dichroic prism 121 to the screen 112.

The red light valve 116, the green light valve 117, and the blue light valve 118 include a liquid crystal display device 134 as an electro-optical device, a first polarizing plate 135, and a second polarizing plate 136. Any one of an electro-optical device 44, an electro-optical device 55, an electro-optical device 81, or an electro-optical device 101 is used for the liquid crystal display device 134. Accordingly, the projection-type display device 111 includes either the electro-optical device 44, the electro-optical device 55, the electro-optical device 81, or the electro-optical device 101.

The electro-optical device 44, electro-optical device 55, electro-optical device 81, and electro-optical device 101 can detect strain in the pixel area 37. Accordingly, the projection-type display device 111 can obtain a high-quality display by appropriately managing the strain of the liquid crystal display device 134.

Sixth Exemplary Embodiment

The electro-optical device 44, electro-optical device 55, electro-optical device 81, and electro-optical device 101 may be used as a display unit of an electronic apparatus such as a projection-type head-up display, a direct-view-type head-mounted display, an electronic book, a personal computer, a digital still camera, and a liquid crystal television, or the like. In addition, the electro-optical apparatus 44, the electro-optical device 55, the electro-optical device 81, and the electro-optical device 101 may be used as a display unit of an electronic apparatus such as a viewfinder type or monitor direct view type video recorder, a car navigation system, an electronic organizer, a Point Of Sales system (POS), or the like.

The electro-optical device 44, the electro-optical device 55, the electro-optical device 81, and the electro-optical device 101 can detect strain in the pixel area 37. Accordingly, the electronic device described above can appropriately manage the distortion of the liquid crystal display device, and obtain a high-quality display.

What is claimed is:

1. An electro-optical device, comprising:
an electro-optical panel including:
a first strain sensor element including a first resistance member and a second strain sensor element including a second resistance member that are provided in a pixel area; and
a first wiring electrically coupling the first strain sensor element and the second strain sensor element; and
a strain detection circuit including:
a first variable resistance member;
a second variable resistance member;
a second wiring electrically coupling the first variable resistance member and the second variable resistance member; and
a galvanometer electrically coupled to the first wiring and the second wiring,
wherein the first variable resistance member, the second resistance member and the galvanometer are provided in a circuit area different from the pixel area.

2. The electro-optical device according to claim 1, wherein the electro-optical panel comprises a data line and a pixel electrode, the first strain sensor element and the second strain sensor element are provided in a layer between the data line and the pixel electrode, and a constant potential is applied to the first strain sensor element and the second strain sensor element.

3. The electro-optical device according to claim 1, wherein
the first strain sensor element and the second strain sensor element include a light shielding material.

4. The electro-optical device according to claim 1, wherein
the first strain sensor element and the second strain sensor element are provided in a first substrate of the electro-optical panel.

5. The electro-optical device according to claim 1, wherein
the first strain sensor element is provided in a first substrate of the electro-optical panel, and
the second strain sensor element is provided in a second substrate of the electro-optical panel.

6. The electro-optical device according to claim 1, wherein
the first strain sensor element is provided along pixels arranged in a first direction of the pixel area, and
the second strain sensor element is provided along the pixels arranged in a second direction that intersects with the first direction.

7. An electronic apparatus, comprising:
the electro-optical device according to claim 1.

8. An electro-optical device, comprising:
an electro-optical panel including:
a first strain sensor element including a first resistance member and a second strain sensor element including a second resistance member that are provided in a pixel area; and
a first wiring electrically coupling the first strain sensor element and the second strain sensor element;
a first variable resistance member;
a second variable resistance member; and
a second wiring electrically coupling the first variable resistance member and the second variable resistance member, wherein
the second substrate is provided with a common electrode and a strain sensor element electrode in an opening portion of the common electrode, the strain sensor element electrode is electrically coupled to the second strain sensor element, and
the first substrate is provided with a strain-sensor element terminal electrically coupled to the strain sensor element electrode and also electrically coupled to the first strain sensor element.

9. An electro-optical device, comprising:
an electro-optical panel including:
a first strain sensor element including a first resistance member, the first strain sensor element being provided in a pixel area;
a second strain sensor element including a second resistance member, the second strain sensor element being provided outside the pixel area and along the pixel area; and
a first wiring electrically coupling the first strain sensor element and the second strain sensor element;
a first variable resistance member;
a second variable resistance member; and
a second wiring electrically coupling the first variable resistance member and the second variable resistance member.

* * * * *